United States Patent
Sinow et al.

(10) Patent No.: US 8,558,583 B2
(45) Date of Patent: Oct. 15, 2013

(54) SLEW DETECTION FOR HIGH VOLTAGE ISOLATION REGION

(75) Inventors: Victor Samuel Sinow, Cambridge, MA (US); Bharath Balaji Kannan, Manchester, NH (US); Robert A. Neidorff, Bedford, NH (US)

(73) Assignee: Texas Instruments Incorporated, Dallas, TX (US)

( * ) Notice: Subject to any disclaimer, the term of this patent is extended or adjusted under 35 U.S.C. 154(b) by 512 days.

(21) Appl. No.: 12/758,357

(22) Filed: Apr. 12, 2010

(65) Prior Publication Data

US 2011/0248751 A1    Oct. 13, 2011

(51) Int. Cl.
*G11C 8/08* (2006.01)
*H03K 3/00* (2006.01)

(52) U.S. Cl.
USPC .......................... 327/108; 327/170; 327/379

(58) Field of Classification Search
USPC ......... 327/108–112, 170, 374–377, 379, 284; 326/21–24, 82–84, 89
See application file for complete search history.

(56) References Cited

U.S. PATENT DOCUMENTS

| | | | |
|---|---|---|---|
| 5,742,196 A * | 4/1998 | Fronen et al. | 327/382 |
| 6,353,345 B1 * | 3/2002 | Yushan et al. | 327/112 |
| 6,529,061 B1 * | 3/2003 | Orita | 327/381 |
| 6,538,481 B1 | 3/2003 | Suetsugu | |
| 7,212,033 B2 * | 5/2007 | Subramanian et al. | 326/68 |
| 7,432,745 B2 * | 10/2008 | Hwang et al. | 327/108 |
| 8,026,549 B2 * | 9/2011 | Chen et al. | 257/335 |
| 2008/0238492 A1 | 10/2008 | Junus et al. | |
| 2008/0297223 A1 * | 12/2008 | Duppils et al. | 327/333 |
| 2009/0140796 A1 * | 6/2009 | Wong et al. | 327/538 |
| 2010/0271079 A1 * | 10/2010 | Choi et al. | 327/108 |

* cited by examiner

*Primary Examiner* — Thomas J Hiltunen
(74) *Attorney, Agent, or Firm* — William B. Kempler; W. James Brady, III; Frederick J. Telecky, Jr.

(57) ABSTRACT

A system includes control circuitry configured to provide one or more control pulses in response to a command signal, the one or more control pulses being communicated from the control circuitry to associated circuitry via a connection. A detector is configured to detect a disturbing signal that mitigates reception of the one or more control pulses via the connection. The command signal is controlled to cause the control circuitry to provide one or more additional control pulses when the disturbing signal is detected by the detector to improve a likelihood of the reception of the one or more control pulses via the connection.

21 Claims, 4 Drawing Sheets

SLEW DETECTION FOR HIGH VOLTAGE ISOLATION REGION

TECHNICAL FIELD

The invention relates to electrical power devices and, more particularly, to a system and method for slew detection for a high voltage isolation region.

BACKGROUND

Power devices have been widely used in various applications including inverters or converters for controlling motors, various power sources and switches. Power devices are typically driven and controlled by electronic circuits constructed of interconnected semiconductor devices and electronic elements. The functions of power devices and the driving and controlling of power devices are performed by low voltage integrated circuits (ICs) of several tens of volts and high voltage ICs of several hundreds of volts. Power devices and drive and control circuits are integrated on a single substrate in order to reduce the overall size of power ICs. Thus, a power IC includes both low and high voltage regions. The high voltage region is isolated from the low voltage region to shield the low voltage region from excessive electric field that can cause breakdown. In certain circumstances, slewing can occur in the high voltage region, which can adversely affect control implemented by circuitry in the low voltage region.

SUMMARY

The invention relates to electrical power devices and, more particularly, to a system and method for slew rate detection for a high voltage isolation region.

One aspect of the invention provides a system that includes control circuitry configured to provide one or more control pulses in response to a command signal, the one or more control pulses being communicated from the control circuitry to associated circuitry via a connection. A detector is configured to detect a disturbing signal that mitigates reception of the one or more control pulses via the connection. The command signal is controlled to cause the control circuitry to provide one or more additional control pulses when the disturbing signal is detected by the detector to improve a likelihood of the reception of the one or more control pulses via the connection.

Another aspect of the invention provides an integrated circuit (IC) that includes a high voltage isolation region that comprises a high-side driver. The high-side driver has a driver output configured to provide a high-side voltage for driving a gate of an external field effect transistor. The IC also includes a low voltage region outside of the high voltage isolation region. The low voltage region includes a lateral double diffused metal-oxide-semiconductor (LDMOS) transistor coupled to transmit a signal from the low voltage region to the high voltage isolation region for controlling the high-side driver. The LDMOS transistor has a parasitic capacitance through which slew current passes during a slewing condition in the high voltage isolation region. A current source is coupled in series with the LDMOS transistor for effecting current flow through the LDMOS transistor in response to a control signal. A slew detector is configured to provide a slew detection signal based on the slew current passing through the parasitic capacitance.

Still another aspect of the invention relates to a method for controlling a power device. The method includes generating one or more control pulses in response to a command signal, the one or more control pulses being communicated to a connection for controlling the power device. A disturbing condition is detected, which is associated with the connection that mitigates reception of the one or more control pulses via the connection. The command signal is controlled in response the detection of the disturbing condition so that one or more additional control pulses are generated during the disturbing condition to thereby increase an effectiveness of the command signal.

DETAILED DESCRIPTION

The invention relates to a detection of a disturbing signal that can reduce the effectiveness of control implemented for a power device. The disturbing signal is described in the context of a slewing condition. As used herein, the terms "slew," "slewing" and "slewing condition" refer to a transitional state of a signal at a given point in a circuit, such as when the signal changes from one level to another level. The maximum rate of change in a voltage signal at a point in a circuit from one voltage to another voltage is known as the slew rate. As an example, the detection of the disturbing signal can be implemented to detect a slewing condition for a high voltage isolation region of an integrated circuit device, such as implemented on a semiconductor substrate.

High-side circuitry implemented within the high voltage isolation region of the integrated circuit can be configured to drive a high-side field effect transistor (FET). To control the high-side FET, low voltage control circuitry is implemented in a region of the IC outside of the high voltage isolation region. The low voltage control circuitry can include a control FET (e.g., a lateral double diffused metal-oxide semiconductor (LDMOS) transistor) for transmitting a control signal to the high-side circuitry. Despite efforts to reduce it, the control FET has a parasitic capacitance through which slew current passes during a slewing condition within the high voltage isolation region. A slew detector is coupled to the low voltage control circuitry for detecting slew current that is provided from the high voltage isolation region during a slewing condition thereof. The slew detector can provide a corresponding slew output signal that is indicative of the detected slewing condition. Controls can thus be implemented based on the slew output signal for enhanced operation.

Figure 1:
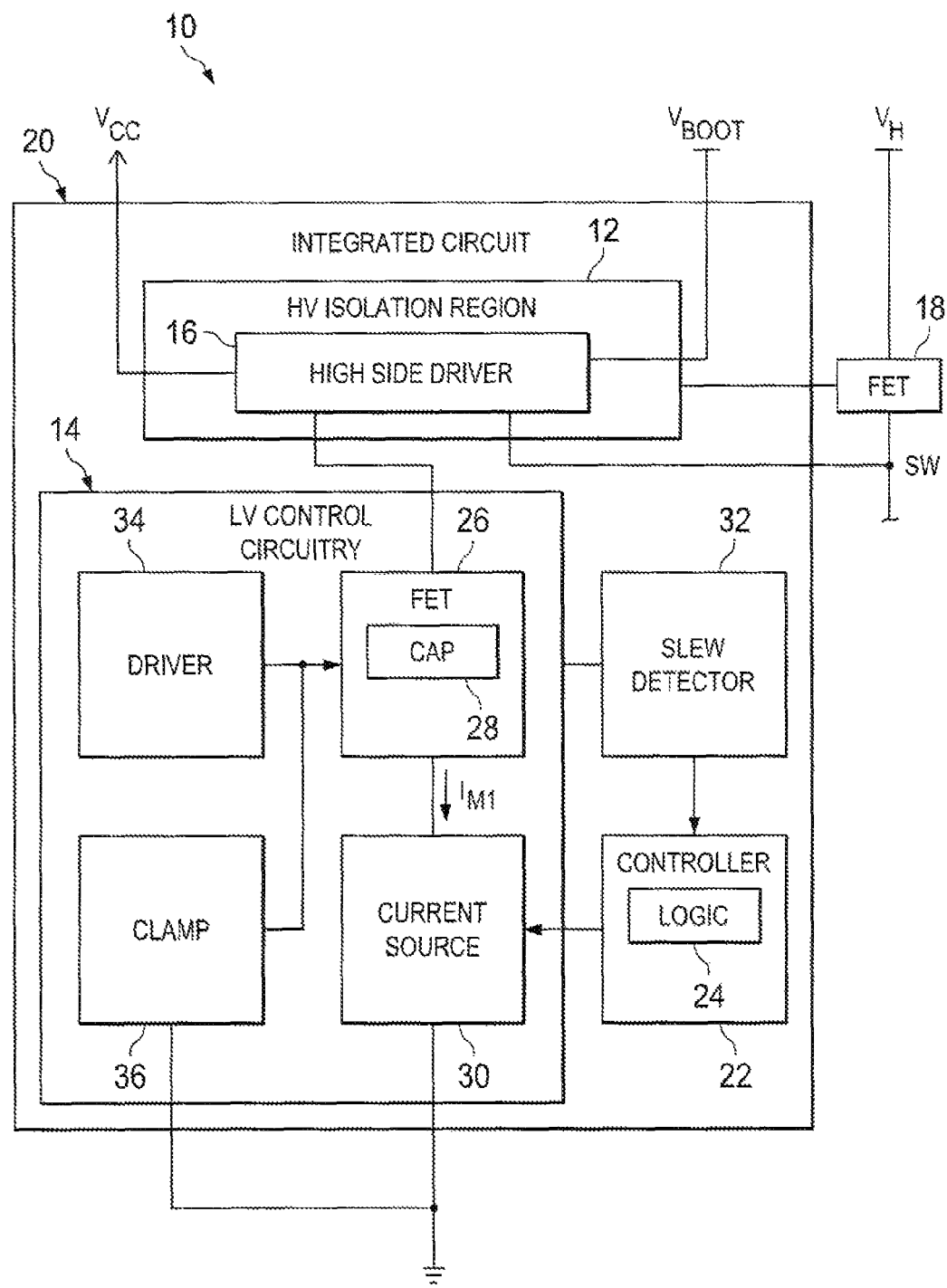
FIG. 1 is a block diagram depicting a system for detecting slew according to an aspect of the invention.

FIG. 1 depicts an example of a system 10 implementing slew detection for a high voltage isolation region 12. The system 10 includes low voltage control circuitry 14 that resides outside of the high voltage isolation region 12. The low voltage control circuitry 14 is configured for controlling operation of circuitry within high voltage isolation region 12, such as including a high-side driver 16. The high-side driver 16 is coupled for operating a power switching device 18. The power device 18 can be an external FET connected to an output of an integrated circuit (IC) 20 containing the high voltage isolation region and the low voltage control circuitry 14. In the example of FIG. 1, the power device 18 corresponds to a high-side FET of a bridge circuit that is coupled between $V_H$ and a switching node (SW). SW can define a ground voltage for the high voltage isolation region 12. The high-side driver 16 is also coupled to $V_{DD}$ of the high voltage isolation region 12, indicated at $V_{BOOT}$. This voltage $V_{BOOT}$ can float anywhere from the $V_{CC}$ of the integrated circuit 20 up to a high voltage, which can be equal to or higher than $V_H$. In the example of FIG. 1, the high-side driver 16 can provide means for driving the power device 18.

The high-side driver 16 and any other circuitry within the high voltage isolation region 12 are isolated in the IC 20 relative to the low voltage control circuitry 14 as to shield the low voltage region from excessive electric field that can cause breakdown. The low voltage control circuitry 14 provides means for controlling the high-side driver 16 in response to a control signal from a controller 22. The controller 22 can be programmed with logic 24 to implement corresponding control for turning on and off the power device 18. The power device 18 can be a high-side FET that forms part of a bridge circuit with a low-side FET (not shown). The high voltage isolation region 12 can float anywhere between $V_{CC}$ of the integrated circuit 20 up to or above the high voltage potential $V_H$ (e.g., 700 volts).

By way of example, the circuitry in the isolation region 12 is maintained between SW (corresponding to ground) and $V_{CC}$ when the high-side FET 18 is off. When the FET 18 is turned on (in response to the control signal from the controller 22 controlling the low voltage control circuitry 14), the voltage in the isolation region 12 can slew up to or above the bridge voltage of $V_H$. This occurs because the voltage from the gate to the source of the high-side FET 18 must be held at a certain potential to keep it turned on. A bootstrap capacitor can be connected between $V_{BOOT}$ and SW to help provide the gate-to-source voltage and the required gate charge for the power FET 18. Thus, as the source of the FET 18 slews high, its gate also slews high. Additionally, in some resonance power conversion applications, the isolation region 12 can began to slew towards the high bridge voltage $V_H$ before the high-side FET 18 turns on. This is called zero-voltage switching and is applicable to various switching topologies.

The input signal from the low voltage control circuitry 14 is a ground reference logic signal that needs to be leveled shifted into the high voltage isolation region 12 to precipitate a response from the high-side driver circuitry 16. The logic signal can be transmitted to the high voltage region 12 via another FET 26 that is coupled to the high-side driver 16 and to the low voltage control circuitry 14. For example, the FET 26 can have its drain coupled to the high-side driver 16 and have its gate and source coupled to components of the low voltage control circuitry. The FET 26 can further be connected to $V_{BOOT}$ through a resistance (not shown). The FET 26 can be implemented as an LDMOS transistor capable of withstanding the floating high voltage that occurs within the high voltage isolation region 12 and thus helps to protect the other circuitry in the low voltage region. While the high voltage FET 26 can itself withstand the floating high voltages, the FET has a parasitic capacitance, schematically indicated at 28, which is coupled between its drain and gate. For example, in an FET 26 designed to stand off the high voltage $V_H$, the parasitic capacitance 28 is quite large, such as ranging from about 0.1 pF to about 1 pF, or more.

Consequently, when the isolation region voltage is stewing, which can be positive slewing or negative slewing, current proportional to the slew rate flows through the parasitic capacitance 28. This stewing thus causes a common mode voltage drop on the drain of the FET 26. For large current magnitudes, the voltage drop can be sufficiently high given that the drain of the FET 26 will be clamped at the ground (SW) of the isolation region 12. The drain of the FET 26 will be clamped to $V_{BOOT}$ during positive slew. If the controller 22 were to activate a current source 30 to turn on (or turn off) the FET 26 during a slew condition, such as to implement zero voltage switching, the signal would not be detectable in the high-side driver 16. For example, the current flow would not yield an appropriate differential signal in the high-side driver 16 since the drain has already been forced near an edge of its operating range such that additional current through the FET 26 would not turn on or turn off the associated power device 18.

The example embodiments described herein can be implemented to facilitate operation of the system 10 during such stewing conditions. In order to facilitate operation of the system 10 during such slewing conditions, the system 10 includes a slew detector 32 that is coupled to the low voltage control circuitry 14 for detecting the stewing condition in the high voltage region. The slew detector 32 provides a corresponding slew output signal to the controller 22 for indicating the occurrence of a stewing condition in the high voltage isolation region. For instance, the slew detector 32 can be coupled to detect slew current flowing through the parasitic capacitance 28 corresponding to the slewing condition. The slew detector 32 can be implemented as including a comparator for comparing a detected voltage, which varies as a function of current slewing in the parasitic capacitance $C_{GD}$ of the high voltage isolation region, relative to a threshold voltage. The threshold can be fixed or variable depending upon implementation and application requirements.

By way of further example, the low voltage control circuitry 14 can also include a driver 34 that is configured to provide a gate drive signal to the FET 26, as is known in the art. Additionally, a clamp circuit 36 can be coupled to the gate of the FET 26 for holding the voltage at the gate of the FET substantially constant. Those skilled in the art will understand and appreciate various types of clamp circuits that can be implemented for holding the gate of FET 26 substantially constant to facilitate turn on and turn off of the current through the FET based on the control signal provided by the controller 22 to the current source 30. The clamp 36 and the FET 26 thus can form a cascode. The slew detector 32 thus can be coupled to such cascode for detecting the slewing condition in the high voltage region. As one example, the slew detector 32 can be coupled to the gate of the FET to detect the gate voltage, which is proportional to the stewing current through the parasitic capacitance 28. Alternatively, the slew detector 32 can be coupled to the clamp 36 for monitoring current, such as through a current sense resistor. In this alternative example, the slew detector 32 can detect the slewing current that propagates through the clamp 36 based on the voltage across the current sense resistor.

In order to effectively control the high-side driver FET 18 proximate a stewing event in the high voltage isolation region 12, the controller 22 provides the control signal as a plurality of control pulses. The control pulses draw current through the FET 26 from the high-side driver 16 as corresponding current pulses while the slewing condition exists. For example, the slew detector 32 can provide the stew output signal as a logic signal that is asserted to indicate the occurrence of a slewing condition. While the stewing condition exists, the controller 22 can control the current source 30 by providing a series of control pulses (e.g., having a desired duty cycle, such as 50%). After the slew detector signal is no longer asserted, indicating the slewing condition has ended, the controller 22 can terminate the pulses. Additionally, after the stewing condition has terminated, the controller 22 can implement logic 24 to provide one or more (e.g., 1 or 2) additional pulses to ensure that the proper control signal has been supplied to and detected by the high-side driver for operating the FET 18. This manner of control is in sharp contrast to many existing approaches that tend to provide a constant on pulse that is provided with a duration commensurate with and typically exceeding a slewing event. As a result of ensuring proper operation (by providing pulses during the slewing condition), a shorter control pulse can also be provided to activate the high-side driver during normal operation in the absence of detecting slewing. Therefore, overall reduced power consumption can be achieved since the traditional longer turn-on pulses are not required. Stated differently, the slew detection provides feedback information that allows enhanced control of circuitry in high voltage isolation region 12 that can exhibit improved performance based on the feedback information.

Figure 2:
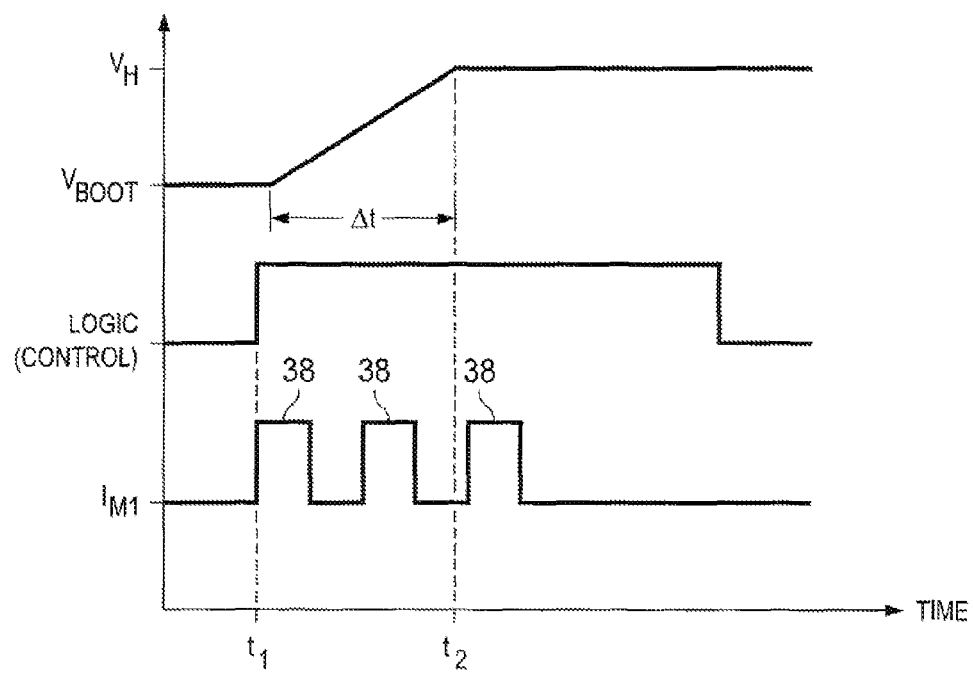
FIG. 2 is a graph depicting an example relationship among signals in the system of FIG. 1.

By way of illustration, FIG. 2 depicts an example timing diagram for signals in the system 10 of FIG. 1 associated with controlling the high side during a stewing condition. In the example of FIG. 2, a slewing condition exists between times t1 and t2, which is indicated as a time interval Δt. During the slewing condition in the high voltage isolation region (between times t1 and t2), the $V_{BOOT}$ signal floats from $V_{CC}$ to a voltage greater than $V_H$. A LOGIC signal within the controller 22 is also depicted as a logic high pulse that is utilized to control the current source 30 to effect current $I_{M1}$ to flow through the FET 26, which includes slew current from the isolation region.

The slew detector 32 asserts its output to the controller 22 in response to detecting the slewing condition. While the slew output is asserted, the controller 22 provides the control signal as discrete control pulses for controlling the current source 30. As a result, the current source 30 provides a series of discrete current pulses 38 (e.g., two or more pulses). The discrete current pulses 38 can be provided repeatedly until the slewing condition has ended. As shown, the slewing condition lasts a duration Δt that is substantially less than the duration that the LOGIC signal is asserted for turning on or off the power device 18. For example, each pulse can have a predetermined duty cycle (e.g., 50%) and a period that is less than one-half Δt, such that more than one current pulse can be provided during a slewing condition.

If no slewing is detected, a single current pulse 38 can be utilized. The controller can provide current control signals such that each current pulse 38 in the normal operating mode can be shorter (e.g., having a period of about ¼$^{th}$ or less) than the LOGIC control signal is asserted. Those skilled in the art will understand that the width of the control pulses and hence the current pulses 38 can be set according to application requirements. The use of current control pulses in this manner can result in significant power savings relative to existing approaches that require a single constant pulse of current commensurate with the LOGIC signal to turn on the current source 30. Thus, by providing pulses in this manner based upon the feedback provided by the slew detector 32, the average current consumption can be much lower than existing approaches.

Figure 3:
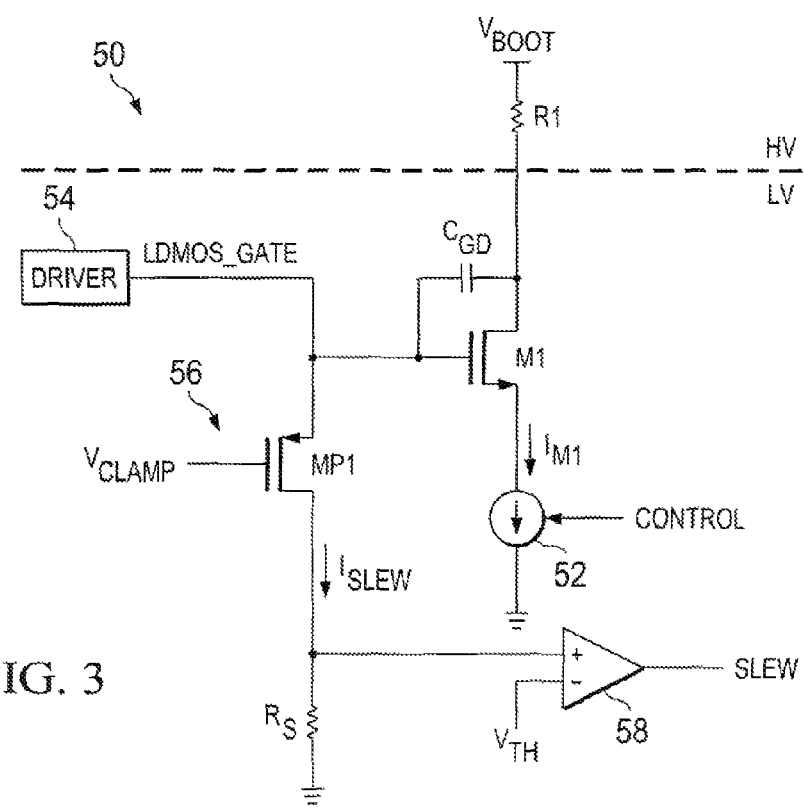
FIG. 3 is a circuit diagram depicting a portion of a system for detecting slew in a high voltage isolation region according to an aspect of the invention.
Figure 4:
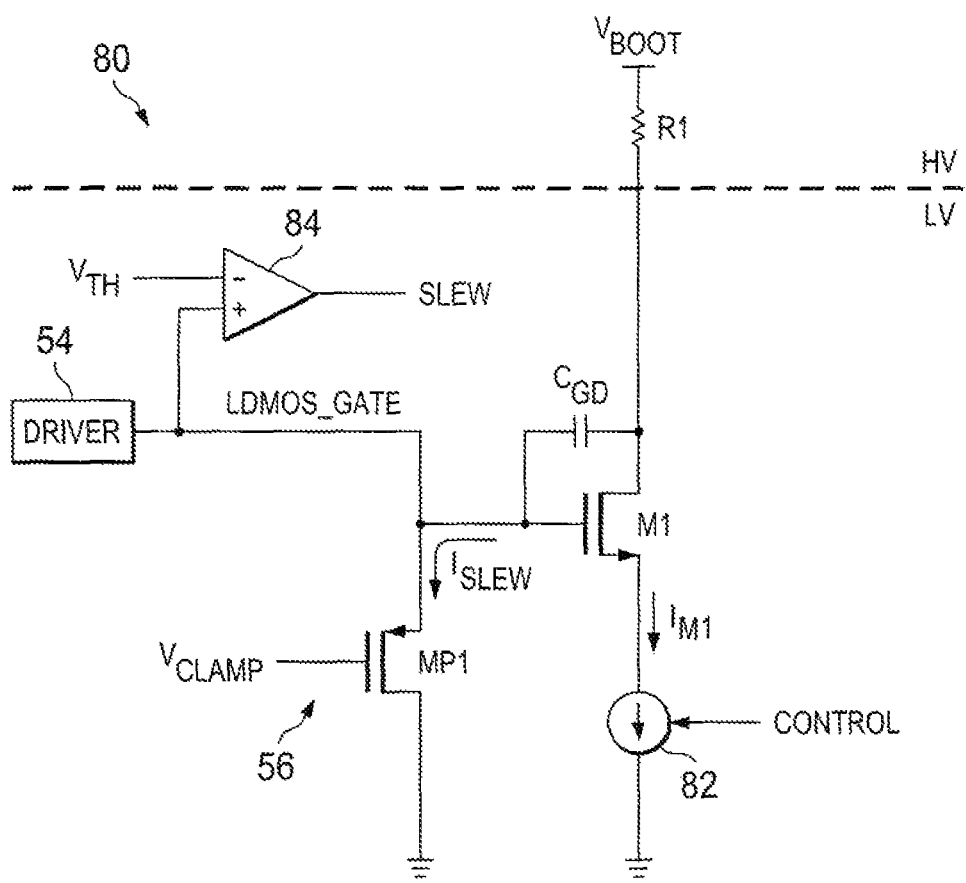
FIG. 4 is a circuit diagram another example of a system for detecting slew in a high voltage isolation region according to an aspect of the invention.

FIGS. 3 and 4 are examples of two different approaches that can be implemented for detecting a slewing condition. For sake of simplicity and not by way of limitation, similar components and circuitry in the high voltage isolation region (HV) and the low voltage region (LV) are identified by the same reference characters in the examples of FIGS. 3 and 4.

Turning to FIG. 3, an FET M1 is connected to $V_{BOOT}$ (e.g., corresponding to $V_{DD}$ of the high voltage isolation region) through a series resistor R1 located in the high voltage region). As described herein, $V_{BOOT}$ can float between $V_{CC}$ of the IC and a high voltage. M1 is connected to pull current indicated as $I_{M1}$ from the high voltage region in response to operation of a current source 52. The current source 52 can operate in response to a logic control signal provided from a controller, such as to turn on an associated FET that is coupled to circuitry in the high voltage region. M1 can be implemented as a high voltage LDMOS transistor and thus includes a corresponding parasitic capacitance, indicated as $C_{GD}$, between the gate and drain thereof.

The gate of M1 can be held at a substantially fixed voltage via an LDMOS_GATE voltage supplied by a driver 54. To further help maintain the voltage at the gate to be substantially constant, and thereby facilitate operation of the system 50, a clamp 56 can also be coupled to the gate. In the example of FIG. 3, the clamp 56 is implemented as including a PMOS transistor MP1 that is coupled between the gate of M1 and ground. MP1 and M1 thus form a cascode. A clamp voltage $V_{CLAMP}$ is supplied to the gate of MP1, such as a DC gate bias for MP1.

As described herein, during a slewing condition in the high voltage region of the system 50, slewing current, indicated at $I_{SLEW}$, flows through the parasitic capacitance $C_{GD}$ proportional to the slew rate. In the example of FIG. 3, the stewing current $I_{SLEW}$ also flows through MP1 to ground. In order to detect the stewing condition via the stewing current $I_{SLEW}$, a sense resistor having a low resistance $R_S$ is coupled between the drain of MP1 and ground. Thus, the stewing current $I_{SLEW}$ results in a voltage drop across $R_S$ corresponding to the slewing current.

A comparator 58 can be coupled to the drain of MP1 to detect the voltage drop across $R_S$. The comparator 58 compares the voltage across $R_S$ relative to a threshold voltage $V_{TH}$ and, in turn, provides a slewing output signal indicative of a slewing condition depending on whether the detected voltage exceeds $V_{TH}$. Thus the comparator 58 and/or sense resistor $R_S$ can provide means for detecting slewing. The threshold $V_{TH}$ can be set to a fixed voltage or, alternatively, $V_{TH}$ can be variable such as by providing more than one selectable thresholds. For instance, it may be desirable to change the threshold depending upon when the corresponding driver circuit is on. Such an approach can further conserve additional power. Thus, when sufficient slewing current is present, such that the voltage drop across $R_S$ exceeds the threshold voltage $V_{TH}$, the comparator 58 asserts its slewing output. If the voltage drops across $R_S$ is less than the threshold voltage $V_{TH}$, the slewing output could be non-asserted. An associated controller can monitor the output of the comparator 58 to implement the control, such as described herein.

FIG. 4 depicts another example of slew detection system 80 that can be implemented. The basic components for implementing low voltage control can be substantially identical to the system 50 of FIG. 3. Briefly stated, M1 having parasitic capacitance $C_{GD}$ is coupled to $V_{BOOT}$ via the series resistor $R_1$. A current source 82 is controlled to provide current $I_{M1}$ via M1 for controlling the high-side driver. The gate of M1 is held substantially constant via the LDMOS_GATE signal that is supplied by the driver 54 and is further held at a substantially fixed DC voltage to facilitate operation of M1 via a clamp 56 that includes PMOS MP1. MP1 is biased via the $V_{CLAMP}$ voltage.

To detect a slewing condition in the high voltage isolation region, a comparator 84 is electrically coupled to the gate of M1. Thus, as the slew current $I_{SLEW}$ couples into the LDMOS gate node during the slewing condition (e.g., via $C_{GD}$), MP1 clamps the node voltage to a value that is higher than the nominal bias. The elevated voltage during the slewing condition on the gate is detected by the comparator 84. The comparator 84 compares the LDMOS gate voltage relative to a threshold voltage $V_{TH}$. The comparator 84 thus asserts its output signal SLEW if the detected voltage exceeds the threshold. The comparator 84 thus corresponds to means for detecting slewing. By implementing the comparator 84 at the gate of M1, the feedback information of a slewing condition from the high voltage isolation region can be provided to low voltage control circuitry, such as a controller.

Those skilled in the art will appreciate that by utilizing the parasitic capacitance $C_{GD}$, as in each of the examples herein, no additional LDMOS is required to detect slewing. Thus, the approaches shown and described herein can conserve real estate on the integrated circuit. As described herein, the slew output provided by the slew detector (e.g., 32, 58 or 84) enables control circuitry to modify controls during the slewing condition, which otherwise might potentially prevent turning on or off the high-side driver in the high voltage region. This approach further allows controls to be implemented (e.g., using control pulses) during the stewing condition that can conserve power. This manner of control is effective and efficient as it also allows shorter control pulses (e.g., a single control pulse of the same duty cycle and period as during stewing) to be utilized when no stewing condition has been detected.

It will be further understood and appreciated that the approaches shown and described herein are example implementations and that other approaches consistent with the teachings herein can be implemented. For example, those skilled in the art will understand and appreciate that approaches described herein can also be applied to detect when the switching node in the high voltage region is stewing negatively, such as if the circuit topology were inverted. For instance, instead of a PMOS clamp with a series resistor to ground an NMOS clamp with a resistor to VCC can be utilized to sense the drop induced across that resistor when the current is pulled out of the LDMOS gate node such as during the negative slewing event. That is, the detection scheme can be utilized to detect positive and negative slewing conditions.

Figure 5:
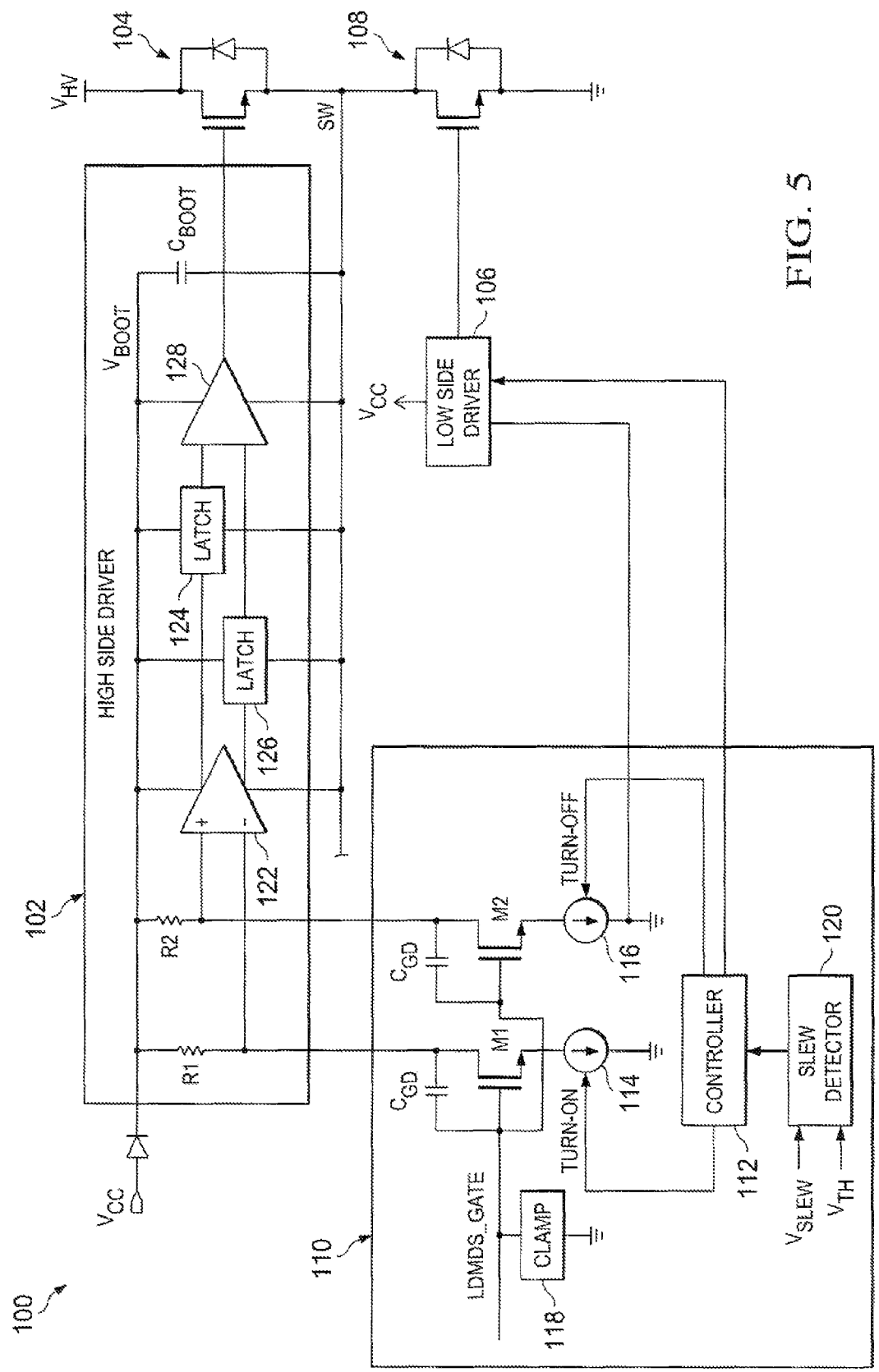
FIG. 5 is a circuit diagram depicting an example of a high-side driver and associated low voltage control circuitry implementing slew detection according to an aspect of the invention.

By way of further context, FIG. 5 depicts an example of a system 100 that can be implemented for controlling circuitry in a high voltage isolation region, including a high-side driver 102. The high-side driver 102 is connected to drive a high-side FET 104, which is coupled between a high voltage rail $V_H$ and a switching node (SW). The SW node can define electrical ground for the high voltage isolation region. The system 100 also includes a low-side driver 106, which can reside outside the high voltage isolation region. The low-side driver 106 is connected to drive a low-side FET 108, which is coupled between SW and ground. The high-side device FET 104 can be connected in a half bridge arrangement with respect to the low-side FET 108, although other arrangements could be utilized.

Also depicted in FIG. 5 is low voltage control circuitry 110 coupled to control the high-side driver 102. In the example of FIG. 5, LDMOS transistors M1 and M2 are coupled to a $V_{BOOT}$ node via respective series resistors $R_1$ and $R_2$. An LDMOS_GATE signal is supplied to the gate of M1 and M2 to maintain operation and facilitate current flow through each of M1 and M2 in response to turn-on and turn-off signals that are provided by a controller 112, such as described herein.

The controller 112 provides the turn-on signal to a current source 114, which is connected in series with M1, to provide a pulse to turn on the associated high-side FET device 104. Conversely, the turn-off pulse is supplied by the controller 112 to control current source 116, which is connected in series with M2, to turn off the high-side FET 104. A clamp 118 is also coupled to the gate node to further ensure proper operation of M1 and M2. The clamp and M1 and M2 form respective cascodes. The controller 112 can also provide turn-on and turn-off signals to control the low-side driver 106 for operating the low-side FET 108 in a mutually exclusive manner relative to the high-side FET 104.

As described herein, the system 100 also includes a slew detector 120 configured to provide feedback information about slewing in the high voltage isolation region, which can be detected according to slewing current that flows through the parasitic capacitance $C_{GD}$ of each of M1 and M2. The slew detector 120 can be connected to detect such slewing in a variety of configurations, including those approaches shown and described herein (see, e.g., FIGS. 1, 3, and 4). For sake of ease of illustration, the detected slewing voltage from the low voltage control circuitry 110 is shown diagrammatically as $V_{SLEW}$ to accommodate various types of connections that can be implemented for the slew detector 120. The slew detector 120 compares $V_{SLEW}$ relative to a threshold voltage $V_{TH}$ and provides a slew detection signal based on such comparison. The controller 112 can thus control the turn-on and turn-off control signals based on the slew detection signal, such as shown and described herein (see, e.g., FIG. 2). For example, the turn-on and turn-off signals can be provided a single pulse (in the absence of slewing being detected) and as a series of plural pulses (while stewing is detected). It will be understood and appreciated that the slew detector 120 can detect slewing for both turn on and turn off situations.

The high-side driver 102 includes a differential detector 122 that has inputs coupled to the drains of LDMOS M1 and M2. In the example of FIG. 5, the drain of M1 is coupled to an inverting input of the detector 116 and the drain of M2 is coupled to the non-inverting input of the detector 122. The differential detector 122 thus supplies differential outputs to corresponding latches 124 and 126. The detector 122 is a level shifting detector that asserts its output to latches 124 and 126 based on through which one of the LDMOS devices M1 or M2 current flows in response to the turn-on or-turn off control signals. Latches 124 and 126 are configured to maintain their outputs at respective levels ($V_{BOOT}$ or SW for the high voltage region) according to outputs provided by the detector 122. The latch outputs are provided to a gate driver 128 that supplies a corresponding output to the gate of the external FET 104. Thus, the differential detector 122 asserts either a turn-on or turn-off condition through the gate driver 128 responsive to the differential voltage supplied via LDMOS devices M1 and M2.

In response to the current of a stewing condition in the high-side driver 102, a common mode voltage drop on the drains of the two LDMOS devices M1 and M2 occurs responsive to the stewing current through the parasitic capacitance $C_{GD}$ thereof. The slew detector 120 can be coupled to the low voltage circuitry 110, such as described herein, to provide a stewing signal, based on which the controller 112 can provide the turn on or turn off signals as a series of pulses during the stewing condition. The controller can provide one or more additional discrete control pulses after the stewing condition ends to ensure that the resulting current pulse (through M1 or M2) is detected by the differential detector 122.

In view of the foregoing those skilled in the art will understand and appreciate that systems and methods have been described to detect stewing (positive or negative stewing) in a high voltage isolation region of an IC. The detected stewing can provide feedback information that affords improved control of circuitry in the high voltage isolation region, such as can conserve power—both during stewing and when no slewing occurs. Additionally, the approaches can be implemented with little increase in real estate.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. A system comprising:
   control circuitry configured to provide one or more control pulses in response to a command signal, the one or more control pulses being communicated from the control circuitry to associated circuitry via a connection;
   a detector configured to detect a disturbing signal that mitigates reception of the one or more control pulses via the connection, wherein the command signal is controlled to cause the control circuitry to provide one or more additional control pulses when the disturbing signal is detected by the detector to improve a likelihood of the reception of the one or more control pulses via the connection, wherein the control circuitry comprises a control field effect transistor (FET) coupled to high-side circuitry, the control FET having a parasitic capacitance through which the disturbing signal passes corresponding to a disturbing condition of a high voltage isolation region.

2. The system of claim 1 further comprising the high-side circuitry residing in the high voltage isolation region of an integrated circuit device, the high-side circuitry being coupled to the control circuitry via the connection for receiving the one or more control pulses, the control circuitry residing in the integrated circuit device outside of the high voltage isolation region.

3. The system of claim 2, wherein the high-side circuitry further comprises a high-side driver that is configured to drive an external power FET connected to an output of the integrated circuit device responsive to the control FET operating based on the control signal.

4. The system of claim 1, wherein the disturbing condition is a slewing condition of the high voltage isolation region, the detector being configured to detect the slewing condition and provide a corresponding slew output signal indicative of the slewing condition.

5. The system of claim 1, wherein the control FET comprises a lateral double diffused metal-oxide-semiconductor (LDMOS) transistor for transmitting a signal from a low voltage region in which the LDMOS resides to the high voltage isolation region to control the high-side circuitry, the parasitic capacitance being between a gate and drain of the LDMOS transistor.

6. The system of claim 4, wherein the control circuitry further comprises:
   a current source coupled between the control FET and ground, the current source controlling current flow through the control FET to control the high-side circuitry in response to the control signal; and
   a controller configured to provide the control signal to turn on the current source.

7. The system of claim 6, wherein the controller further comprises logic configured to provide the control signal as a series of one or more pulses during the slewing condition responsive to the slew output signal.

8. The system of claim 7, wherein the logic is configured to provide one or more one additional command pulses to the control circuitry after the slewing condition ends, such that the control circuitry provides at least one additional pulse to the connection after the slewing condition ends.

9. The system of claim 6, wherein the control FET is a turn-on control FET and the control signal is a turn-on control signal, the system further comprising:
   a turn-off control FET also coupled to the high-side circuitry, the turn-off control FET having a parasitic capacitance through which slew current passes during the slewing condition of the high voltage isolation region; and
   a second current source coupled between the turn-off control FET and ground, the second current source controlling current flow through the turn-off control FET for controlling the high-side circuitry in response to a turn-off control signal provided by the controller,
   wherein the slew detector is configured to detect the slewing condition based on the slew current passing through the parasitic capacitance of at least one of the turn-on control FET and the turn-off control FET.

10. The system of claim 4, wherein the control circuitry further comprises a clamp circuit coupled to maintain a gate voltage for the control FET, the clamp circuit and the control FET defining a cascode, the detector being coupled to the cascode to detect slew current during the slew condition and provide the slew output signal accordingly.

11. The system of claim 10, wherein the detector further comprises:
    a sense resistor coupled between the clamp circuit and ground; and
    a comparator configured to provide the slew output signal based on comparing a slew voltage across the sense resistor relative to a threshold voltage.

12. The system of claim 10, wherein the detector further comprises a comparator configured to provide the slew output signal based on comparing the gate voltage for the control FET relative to a threshold voltage.

13. An integrated circuit (IC), comprising:
    a high voltage isolation region that comprises a high-side driver, the high-side driver having a driver output configured to provide a high-side voltage for driving a gate of an external transistor; and
    a low voltage region outside of the high voltage isolation region, the low voltage region comprising:
       a lateral double diffused metal-oxide-semiconductor (LDMOS) transistor coupled to transmit a signal from the low voltage region to the high voltage isolation region for controlling the high-side driver, the LDMOS transistor having a parasitic capacitance through which slew current passes during a slewing condition in the high voltage isolation region;
       a current source coupled in series with the LDMOS transistor for effecting current flow through the LDMOS transistor in response to a control signal; and
       a slew detector configured to provide a slew detection signal based on the slew current passing through the parasitic capacitance.

14. The IC of claim 13, further comprising a controller configured to provide the control signal to turn on the current source, the controller comprising logic configured to provide the control signal as a series of control pulses during the slewing condition, such that the current flow through the LDMOS transistor is a series of corresponding current pulses.

15. The IC of claim 14, wherein the controller is configured to provide at least one additional control pulse in the control signal after the slewing condition ends.

16. The IC of claim 14, wherein the LDMOS transistor is a first LDMOS transistor and the control signal is a turn-on control signal, the IC further comprising:
a second LDMOS transistor coupled to the high-side driver, the second LDMOS FET having a parasitic capacitance through which the slew current passes during the slewing condition of the high voltage isolation region; and
a second current source coupled in series with the second LDMOS transistor for effecting current flow through the second LDMOS transistor in response to a turn-off control signal from the controller,
wherein the slew detector is configured to detect the slewing condition based on the slew current passing through the parasitic capacitance of at least one of the first and second LDMOS transistors.

17. The IC of claim 13, wherein the low voltage region further comprises a clamp coupled to maintain a gate voltage for the LDMOS transistor, the clamp and the control FET defining a cascode, the slew detector being coupled to the cascode to detect the slewing condition and provide the slew detection signal accordingly.

18. The IC of claim 17, wherein the slew detector further comprises:
a sense resistor coupled in series with the clamp; and
a comparator configured to provide the slew output signal based on comparing a slew voltage across the sense resistor relative to a threshold voltage.

19. The IC of claim 17, wherein the slew detector further comprises a comparator configured to provide the slew output signal based on comparing the gate voltage for the LDMOS transistor relative to a threshold voltage.

20. The IC of claim 14 wherein the IC further comprises:
a low-side driver, the IC being coupled to drive a bridge circuit, the bridge circuit comprising:
a high-side power FET having a gate coupled to an output of the high-side driver, the high-side power FET being connected between a high voltage and a switching node; and
a low-side power FET connected between the switching node and ground, the low-side power FET having a gate coupled to an output of the low-side driver in the low voltage region of the IC.

21. A method for controlling a power device comprising:
generating one or more control pulses in a control circuit separate from the power device in response to a command signal, the one or more control pulses being communicated via a connection for controlling the power device;
detecting in a detection circuit a disturbing condition associated with the connection that mitigates reception of the one or more control pulses via the connection by utilizing a parasitic capacitance of a control FET through which the disturbing signal passes; and
controlling the command signal in response the detection of the disturbing condition so that one or more additional control pulses are generated during the disturbing condition to thereby increase likelihood of reception of the one or more control pulses via the connection.

* * * * *